TRANSISTOR STRUCTURE

Filed Oct. 13, 1964

INVENTORS
LEO ESAKI
ROBERT A. LAFF
BY John F. Ohlandt Jr.
ATTORNEY

United States Patent Office 3,500,141
Patented Mar. 10, 1970

3,500,141

TRANSISTOR STRUCTURE

Leo Esaki, Chappaqua, and Robert A. Laff, Yorktown Heights, N.Y., assignors to International Business Machines Corporation, New York, N.Y., a corporation of New York Filed Oct. 13, 1964, Ser. No. 403,538
Int. Cl. H01j 3/00
U.S. Cl. 317—235 15 Claims

ABSTRACT OF THE DISCLOSURE

The present invention relates to an improved transistor structure wherein the majority carrier mobility in the emitter is greater than the majority carrier mobility in the base and, also, the emitter is doped less heavily than the base so as to reduce emitter capacitance $C_e$. Since the emitter is doped less heavily than the base, an alloyed-in contact is effected through the emitter so as to contact the base whereby base resistance $r_b$ is reduced. In prior art transistor structures wherein the emitter is doped more heavily than the base, alloyed-in base contacts are not feasible because of heavy leakage, or even tunneling, current across the emitter-base junction.

This invention relates to semiconductor devices and, more particularly, to an improved transistor structure and to the techniques of fabricating such a structure.

In recent years the so-called mesa and planar designs have become extremely popular for transistor devices. For a discussion of these transistor designs, reference may be had to an article "Technology of Transistor Mask Fabrication" by P. D. Payne, Semiconductor Products for May 1962, at page 32. In this article many modifications of the basic designs are illustrated. The mesa transistor therein described is one which relies on the application of an acid resist to isolate the discrete collectors and reduce them to their appropriate size, whereas the planar design relies on the fact that the several junctions of the discrete devices, particularly the collector-base junction, are defined by an oxide masking operation instead of a mesa etch. These mesa and planar designs permit the attainment of devices of very small dimensions which aid in the attainment of extremely high speed operation.

In the attainment of ultra high speeds for transistors, two of the important quantities which determine maximum speed of operation are the emitter capacitance $C_e$ and the base resistance $r_b$. Both of these quantities should be small for high speed operation. The technique of the present invention reduces the values of both of these quantities with respect to the values found in more conventional structures without a corresponding deterioration in other important parameters.

Accordingly, the primary object of the present invention is to reduce significantly both of the parameters $C_e$ and $r_b$ in a transistor.

A novel feature of the structure of a transistor in accordance with the present invention is that it employs an emitter which is doped less heavily than the base. $C_e$ is proportional to $\sqrt{N}$ where N is the carrier concentration on the less heavily doped side of the emitter-base junction. Thus, in the structure of the present invention, $C_e$ is determined by the emitter doping and is smaller for a given base doping than the case when the emitter is more heavily doped than the base. An important consequence of the feature of having the emitter doped less heavily than the base is that this then allows the use of an alloyed-in base contact. In the normal high frequency structure, with the emitter concentration heavier than the base concentration, such an alloyed-in contact is not feasible because of the heavy leakage current, or even tunneling current, across the emitter-base junction. The use of this type of base contact results in a reduced $r_b$ by as much as 3–5 times over conventional structures since the only base resistance is that which occurs directly under the emitter and there is no transverse base resistance as in the usual planar geometries.

The novel feature of having an emitter which is doped less heavily than the base is accomplished due to the fact that the mobility of one type of carrier in the semiconductor material which is selected for the device is much higher than the mobility of the other type of carrier. Thus, for example, by selecting a 3–5 compound semiconductor for the device the electron mobility is much higher than the hole mobility. For InSb the electron to hole mobility ratio, $b$, is approximately 30–50 and in GaAs $b$ is approximately 11. This contrasts with Ge, as a typical case for Group IV semiconductors, where $b$ is approximately 2. The low frequency injection efficiency $\gamma_0$ in the npn transistor is determined by the quantity $$\left[1+\frac{1}{b}\left(\frac{P_B}{N_E}\right)\left(\frac{W}{L_{pE}}\right)\right]^{-1}$$

where $P_B$ and $N_E$ are majority carrier concentrations in the base and the emitter, respectively; W and $L_{pE}$ are base width and hole diffusion length in the emitter, respectively. A large value of $b$ allows the ratio $P_B/N_E$ to be much greater than one for a given high injection efficiency. The high frequency injection efficiency $\gamma$ is equal to the low frequency injection efficiency $\gamma_0$ multiplied by a term depending upon frequency and emitter capacitance. Since the emitter capacitance of the structure of the present invention is lower than that of conventional structures, the injection efficiency remains higher at all frequencies than in the case of the normal transistor of low values of $b$.

It should be noted that in the above examples, attention was directed to the situation where the ratio of electron to hole mobility was greater than one. However, it will be apparent that the opposite situation, namely, that where the hole mobility is much higher than the electron mobility, can be similarly utilized in a transistor of opposite polarity, namely, in a pnp transistor.

The foregoing and other objects, features and advantages of the invention will be apparent from the following more particular description of preferred embodiments of the invention, as illustrated in the accompanying drawings.

Figure 1:
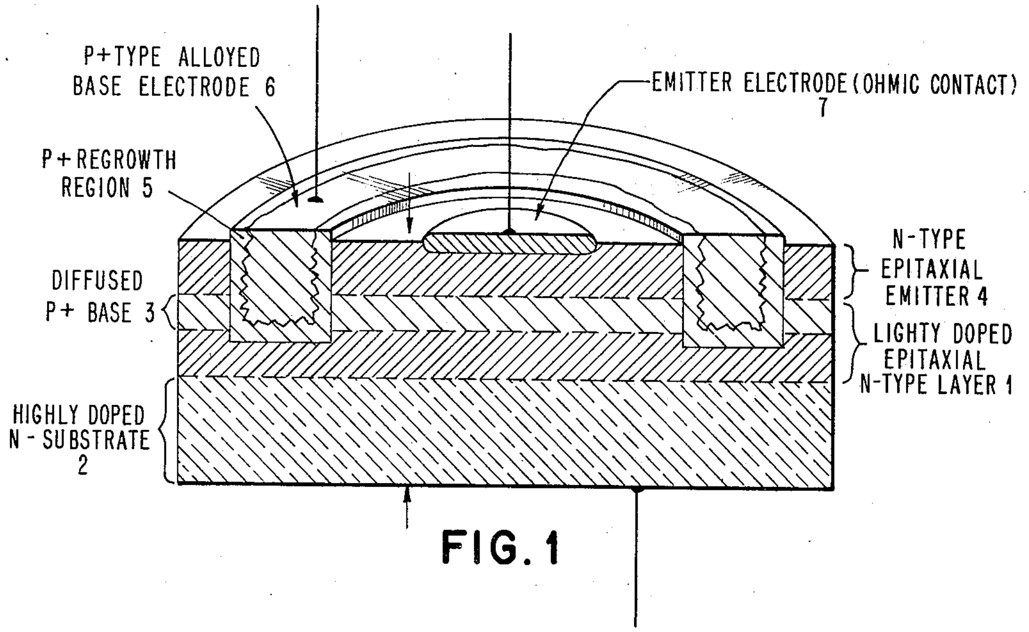
FIGURE 1 is a sectional view of a transistor structure in accordance with the present invention.
Figure 2:
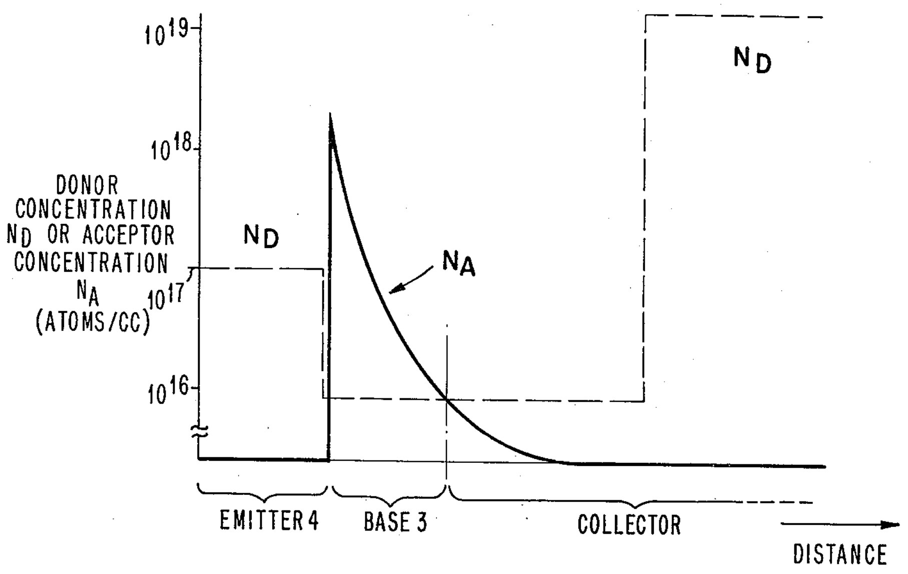
FIGURE 2 illustrates the impurity profile of this transistor.

With reference to FIGURES 1 and 2, the fabrication process of the present invention, as applied to the example of an epitaxial transistor, is as follows. First, a lightly doped n-type layer 1 is formed epitaxially on a highly conducting n-type substrate wafer 2, typically of GaAs. Thereafter, a selected acceptor impurity, for example Zn for the case of GaAs material, is diffused into the GaAs wafer to produce the diffused p+ base region 3. Thus far the procedure has followed conventional techniques.

Thereafter, a relatively lightly doped n-type emitter region 4 is epitaxially deposited at such a temperature that the diffusion of impurities is not significant. For example, a process for growing GaAs epitaxially, as described in the G. A. Silvey patent Ser. No. 59,004, now abandoned, may be employed. The doping for the emitter is selected to have a value of approximately $10^{17}$ atoms/ cc. A typical impurity that would be associated with the growth of the emitter layer 4 would be selenium.

In making contact to the previously diffused base region 3, an alloying procedure is used. Thus, as shown in FIGURE 1, using a typical acceptor impurity such as Zn in the alloy, the alloying is accomplished by rapid heating to the eutectic point and then rapid cooling of the wafer to produce the regrowth region 5, with the total base electrode being designated 6. Of course, several alloyed base contacts can be provided if desired rather than having the base contact in the form of a ring, as shown in FIGURE 1. The emitter electrode 7 is formed as an ohmic contact to the epitaxial emitter region 4 by conventional techniques. Thereafter, suitable conductors for circuit connecting purposes are affixed to the appropriate regions, as shown.

It will be noted that there is an optimum reduction in the base resistance since the only base resistance is that produced by the active portion of the base region 3 which is directly under the emitter region 4. There is no transverse base resistance which ordinarily occurs in conventional mesa or planar designs because of the distance from the actual ohmic contact (made at the surface of the device) to the internal active portion of the base region of the device.

In FIGURE 2, there is illustrated the impurity profile of the device as shown in FIGURE 1. The dotted line represents the donor concentration $N_D$ throughout the transistor and the acceptor concentration $N_A$ is represented by the solid lines. The separate regions of emitter, base and collector have been indicated. It will be appreciated that the collector of the device comprises the unconverted portion of the epitaxial n-type layer 1 and the n-type substrate 2. At the far right it will be seen that the donor concentration $N_D$ is extremely high and this corresponds to the doping in the n-type substrate 2. The lowered concentration $N_D$ in the middle of the graph corresponds to the initial doping in the lightly doped n-type epitaxial region 1, and the intermediate concentration on the left for $N_D$ corresponds to that in the n-type epitaxial emitter 4. The concentration for the acceptors $N_A$ is shown as a graded profile resulting from the diffusion of acceptor impurities into the n-type layer 1.

Although the previous description has been given with regard to the creation of the device on a highly doped n-substrate, this particular procedure is not necessary for fulfillment of the desiderata of the present invention.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process of fabricating a transistor in which the emitter capacitance $C_e$ and the base resistance $r_b$ are substantially reduced comprising the steps of:

providing a wafer of semiconductor material of given conductivity type, defining a collector region, said material having the characteristic that the mobility of one type of carrier therein is greater than the mobility of the other type of carrier, forming a base region of said semiconductor material of opposite conductivity type in contact with said collector region and having a predetermined impurity concentration, and forming an emitter region of said given conductivity type semiconductor material in contact with said base region, said emitter region having an impurity concentration less than said predetermined impurity concentration of said base region, said one type of carrier being the majority carrier in said emitter region.

2. The process of fabricating a transistor in which the emitter capacitance $C_e$ and the base resistance $r_b$ are substantially reduced comprising the steps of:

providing a highly doped substrate of semiconductor material of given conductivity type, said semiconductor material having the characteristic that the mobility of one type of carrier therein is greater than the mobility of the other type of carrier, epitaxially growing a lightly doped layer of said given conductivity type semiconductor material defining a collector region on said substrate, diffusing an opposite conductivity type determining impurity into said collector region to form a base region therein, and epitaxially forming an emitter region of said given conductivity type semiconductor material on said base region, said emitter region having an impurity concentration less than said predetermined impurity concentration of said base region, said one type of carrier being the majority carrier in said emitter region, and alloying a contact through said emitter region to reach said base region.

3. The process of fabricating a transistor in which the emitter capacitance $C_e$ and the base resistance $r_b$ are substantially reduced comprising the steps of:

providing a wafer of semiconductor material of given conductivity type wherein defining a collector region, said semi-conductor material having the characteristic that the ratio of the mobility of one type of carrier to the mobility of the other type of carrier is greater than 5, forming a base region of said semiconductor material of opposite conductivity type in contact with said collector region having a predetermined impurity concentration, and forming an emitter region of said given conductivity type semiconductor material in contact with said base region, said emitter region having an impurity concentration less than said predetermined impurity concentration of said base region, said one type of carrier being the majority carrier in said emitter region.

4. The process as defined in claim 3 wherein the wafer of semiconductor material is composed of GaAs and wherein said ratio is approximately 11.

5. The process as defined in claim 3 wherein the wafer of semiconductor material is composed of InSb and wherein said ratio is approximately 30.

6. A process of fabricating a transistor comprising the steps of:

providing a semiconductor body having therein successive regions alternating in conductivity type defining emitter, base and collector regions, the material of said body having the characteristic that the mobility of one type of carrier therein is greater than the mobility of the other type of carrier, said one type of carrier being the majority carrier in said emitter region, and defining the active portions of said emitter and base regions in said body by alloying a contact through said emitter region at the surface of said body to reach said base region immediately contiguous thereto, said emitter region having an impurity concentration less than the impurity concentration in said base region.

7. A process of fabricating a transistor comprising the steps of:

providing a semiconductor body having therein successive regions alternating in conductivity type defining emitter, base and collector regions, the material of said body having the characteristic that the ratio of the mobility of one type of carrier therein to the mobility of the other type of carrier is greater than 5, said one type of carrier being the majority carrier in said emitter region, defining the active portions of said emitter and base regions in said body by alloying a contact through said emitter region at the surface of said body to reach said base region immediately contiguous thereto, said emitter region having an impurity concentration less than the impurity concentration in said base region.

8. The process of fabricating a transistor as defined in claim 1 including the further step of alloying a contact through said emitter region to reach said base region.

9. The process of fabricating a transistor as defined in claim 3 including the further step of alloying a contact through said emitter region to reach said base region.

10. A transistor wherein emitter capacitance $C_e$ and base resistance $r_b$ are substantially reduced comprising:

a semiconductor body including successive regions of opposite conductivity type defining emitter, base and collector regions, said semiconductor body having the characteristic that the mobility of one type of carrier is greater than the mobility of the other type of carrier, said one type of carrier being the majority carrier in said emitter region, the impurity concentration in said emitter region being less than the impurity concentration in said base region.

11. A transistor as defined in claim 10 wherein said semiconductor body is formed of a material selected from the group consisting of gallium arsenide and indium antiminide.

12. A transistor as defined in claim 10 wherein said semiconductor body is formed by a III–V semiconductor compound.

13. A transistor wherein emitter capacitance $C_e$ and base resistance $r_b$ are substantially reduced comprising:

a semiconductor body including successive regions of opposite conductivity type, selected adjacent regions of opposite conductivity type defining emitter and base regions, respectively, of said transistor, said semiconductor body having the characteristic that the majority carrier mobility in said emitter region is greater than the majority carrier mobility in said base region, the impurity concentration in said emitter region being less than the impurity concentration in said base region.

14. A transistor as defined in claim 13 further including one or more alloyed contacts extending through said emitter region to contact said base region.

15. A transistor as defined in claim 10 wherein said emitter has an impurity concentration of approximately $10^{17}$ atoms/cc.

References Cited

UNITED STATES PATENTS 3,271,208 9/1966 Allegretti ________ 317—235 X

JOHN W. HUCKERT, Primary Examiner

R. F. POLISSACK, Assistant Examiner

U.S. Cl. X.R.

29—577, 589; 148—33.5, 175; 317—234